United States Patent
Kinoshita

(10) Patent No.: US 8,520,421 B2
(45) Date of Patent: Aug. 27, 2013

(54) SEMICONDUCTOR ASSOCIATIVE MEMORY DEVICE

(75) Inventor: Atsuhiro Kinoshita, Kamakura (JP)

(73) Assignee: Kabushiki Kaisha Toshiba, Minato-ku, Tokyo (JP)

(*) Notice: Subject to any disclaimer, the term of this patent is extended or adjusted under 35 U.S.C. 154(b) by 0 days.

(21) Appl. No.: 13/422,435

(22) Filed: Mar. 16, 2012

(65) Prior Publication Data

US 2012/0206963 A1  Aug. 16, 2012

Related U.S. Application Data

(63) Continuation of application No. PCT/JP2009/066431, filed on Sep. 18, 2009.

(51) Int. Cl.
*G11C 15/00* (2006.01)

(52) U.S. Cl.
USPC ............... 365/49.1; 365/185.11; 365/185.33; 365/185.13; 365/230.03

(58) Field of Classification Search
USPC ............ 365/185.11, 230.03, 185.33, 49.1, 365/185.13
See application file for complete search history.

(56) References Cited

U.S. PATENT DOCUMENTS

| | | | |
|---|---|---|---|
| 5,455,784 A | 10/1995 | Yamada | |
| 5,859,791 A | 1/1999 | Schultz et al. | |
| 2009/0190404 A1* | 7/2009 | Roohparvar | 365/185.17 |

FOREIGN PATENT DOCUMENTS

| | | |
|---|---|---|
| JP | 1-223697 A | 9/1989 |
| JP | 7-057479 A | 3/1995 |
| JP | 11-220382 A | 8/1999 |
| JP | 2009-009695 A | 1/2009 |

OTHER PUBLICATIONS

Korean Notification for Filing Opinion dated Dec. 13, 2012 for corresponding Korean Patent Application No. 10-2011-7031145 with English translation consisting of 9 pages.
International Search Report dated Mar. 23, 2010 from PCT/JP2009/066431.
Kostas Pagiamtzis; "Content-Addressable Memory (CAM) Circuits and Architecture: A Tutorial and Survey"; IEEE Journal of Solid-State Circuits, vol. 41, No. 3, Mar. 2006, pp. 712-727.

* cited by examiner

*Primary Examiner* — Jason Lappas
(74) *Attorney, Agent, or Firm* — Ohlandt, Greeley, Ruggiero, & Perle, L.L.P.

(57) ABSTRACT

According to one embodiment, a semiconductor associative memory device comprises a retrieval block having retrieval word strings arranged in a column direction, each of the retrieval word strings includes memory cells arranged in a row direction between a word input terminal and a word output terminal, each of the memory cells having a first input terminal, a second input terminal, and an output terminal, wherein in each retrieval word string, the second input terminal of one of the memory cells is used as the word input terminal, and each of other memory cells is connected to the output terminal of adjacent memory cell by the second input terminal, wherein the first input terminals of the memory cells in the same column are connected.

14 Claims, 11 Drawing Sheets

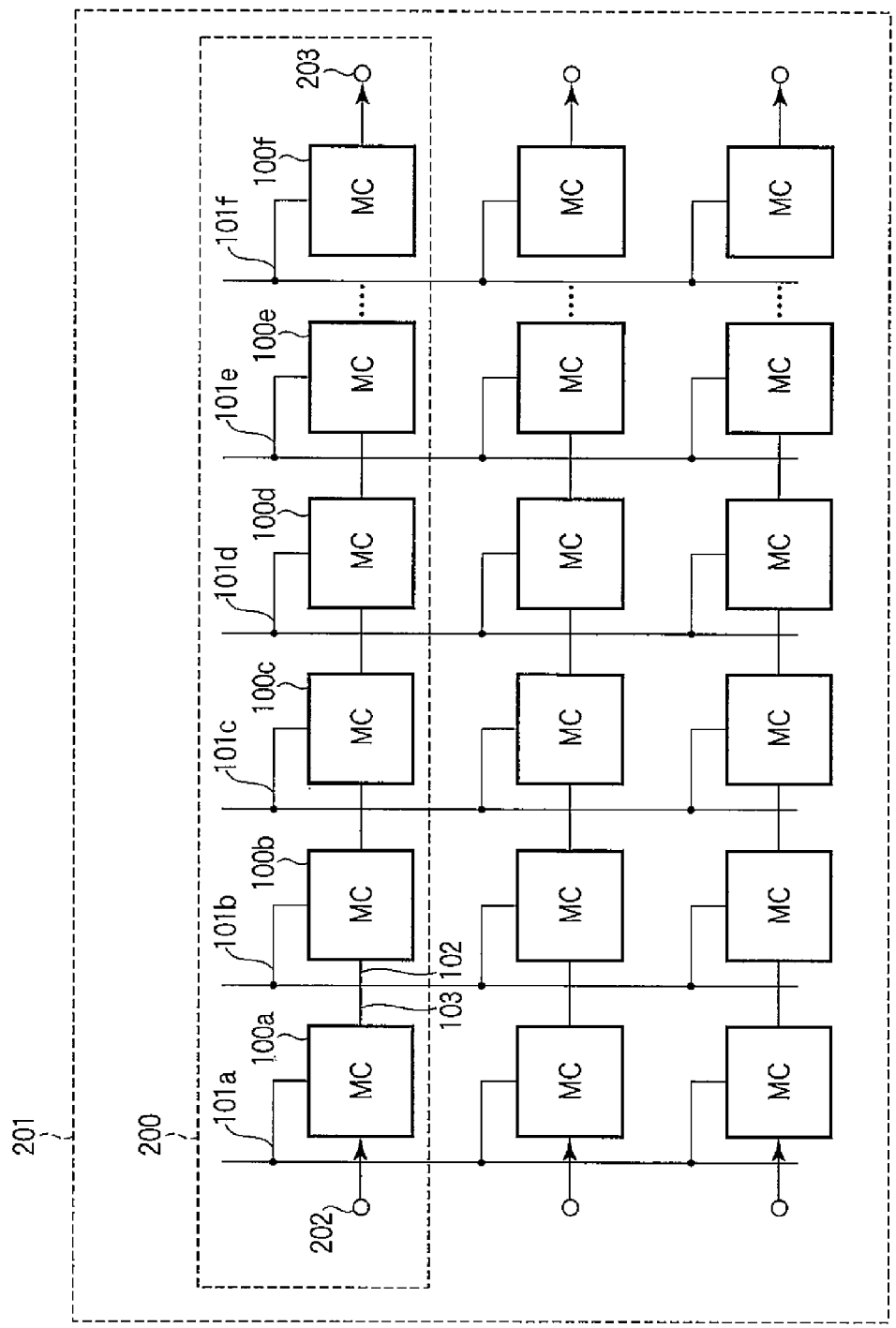
F I G. 1

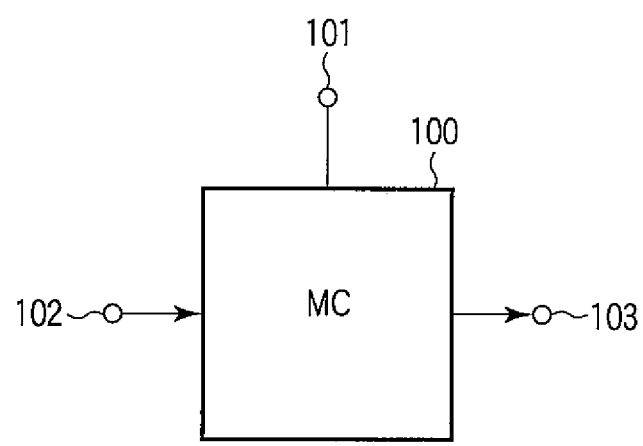
F I G. 2

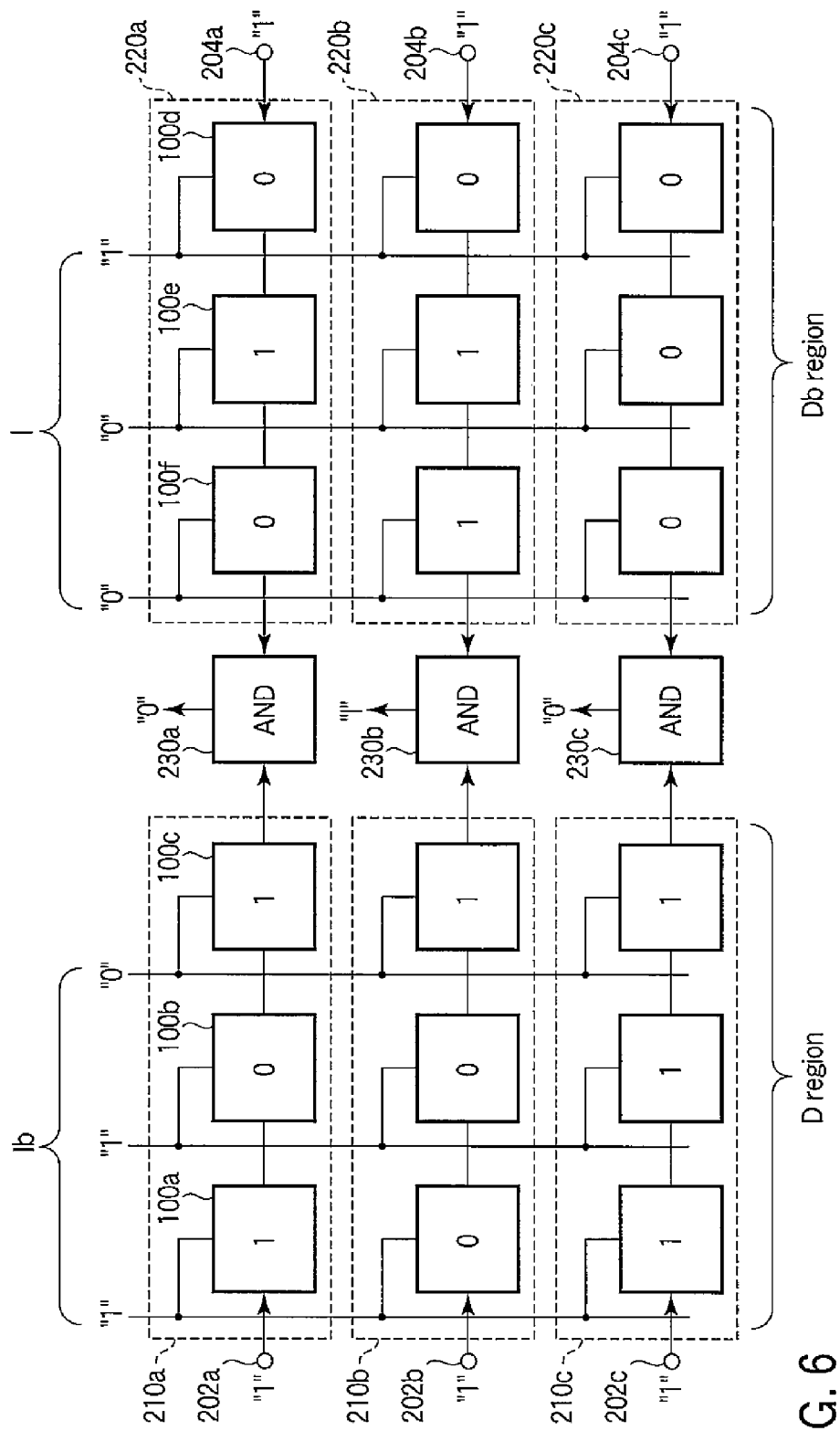
F I G. 6

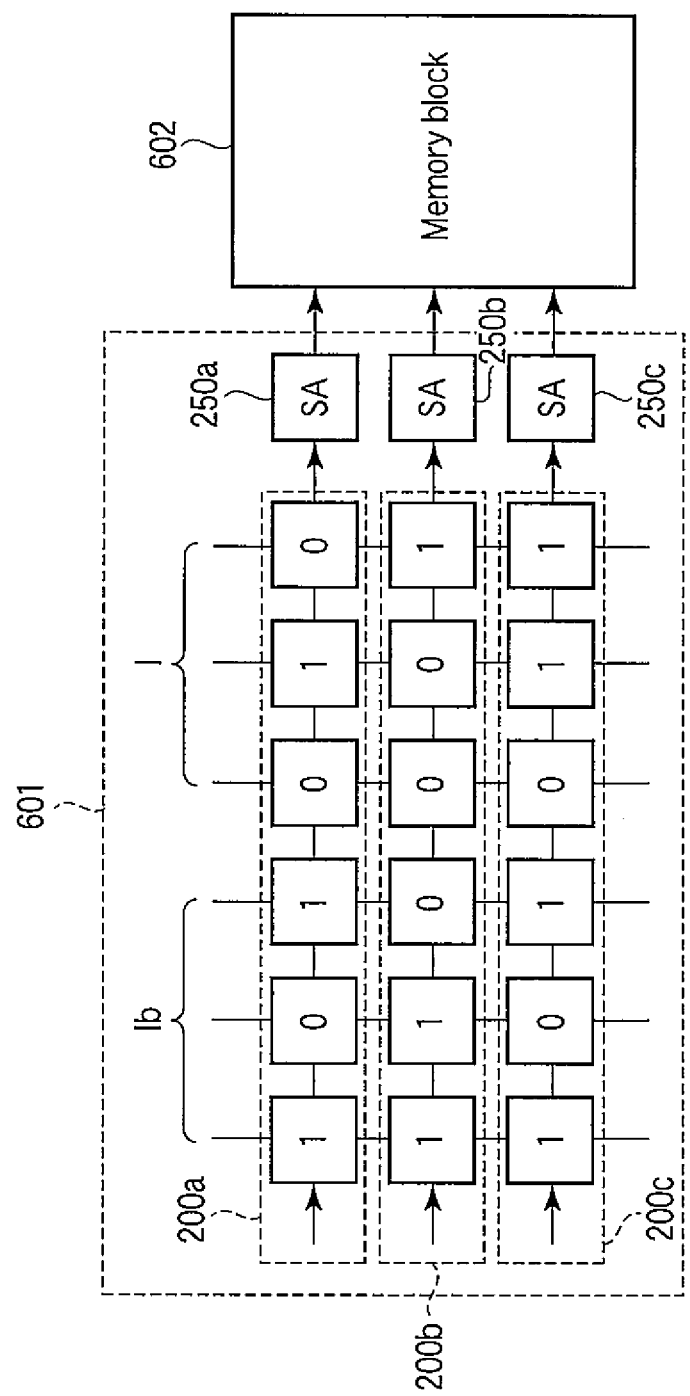
F I G. 8

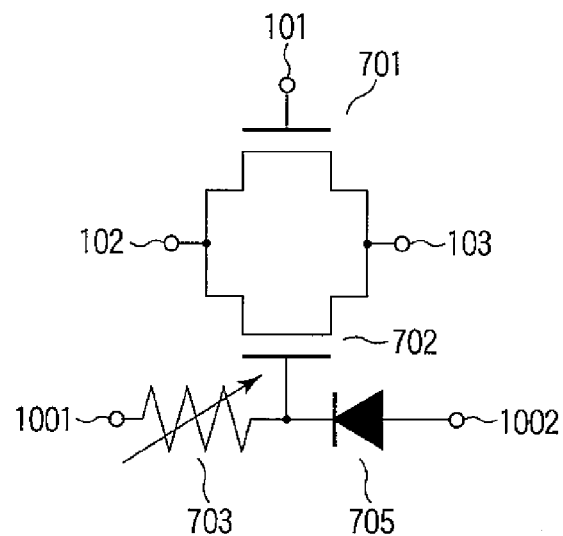
F I G. 11
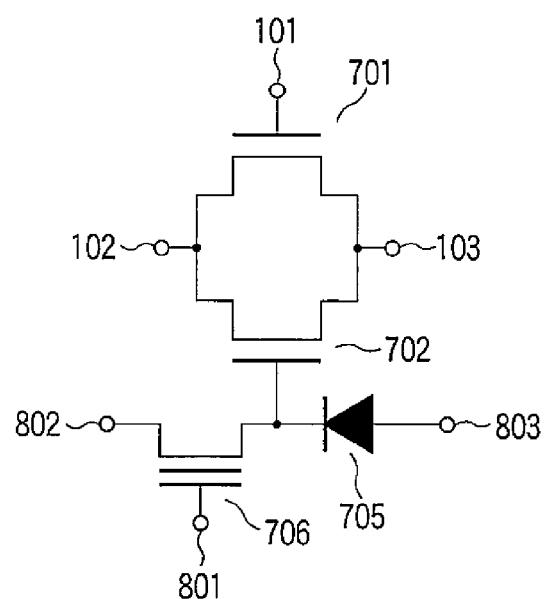
F I G. 12

SEMICONDUCTOR ASSOCIATIVE MEMORY DEVICE

CROSS-REFERENCE TO RELATED APPLICATIONS

This application is a Continuation Application of PCT Application No. PCT/JP2009/066431, filed Sep. 18, 2009, the entire contents of which are incorporated herein by reference.

FIELD

Embodiments described herein relate generally to a semiconductor associative memory device which receives a data word and returns data associated with the data word.

BACKGROUND

As one semiconductor nonvolatile memory, an associative memory (Content Addressable Memory: CAM) is known. The associative memory has a function of retrieving an address having specified content unlike a normal memory in which an address is specified to read and write contents. The associative memory is widely used for applications of cache control of an MPU and address lookup of Internet since it is extremely high speed.

However, a large number of elements are normally required in mounting this type of associative memory, it is difficult to reduce the area and power consumption and its applications are limited (K. Pagiamtzis, IEEE JOURNAL OF SOLID-STATE CIRCUITS 41,712 (2006)).

BRIEF DESCRIPTION OF THE DRAWINGS

FIG. 1 is a block diagram showing the schematic configuration of an associative memory device according to a first embodiment.

FIG. 2 is a block diagram showing the basic configuration of a unit retrieval memory cell used in the first embodiment.

FIG. 6 is a block diagram showing the schematic configuration of an associative memory device according to a second embodiment.

FIG. 8 is a diagram showing the schematic configuration of an associative memory device according to a fourth embodiment.

FIG. 11 is a circuit diagram showing the concrete configuration of a unit retrieval memory cell.

FIG. 12 is a circuit diagram showing the concrete configuration of a unit retrieval memory cell.

DETAILED DESCRIPTION

Figure 3:
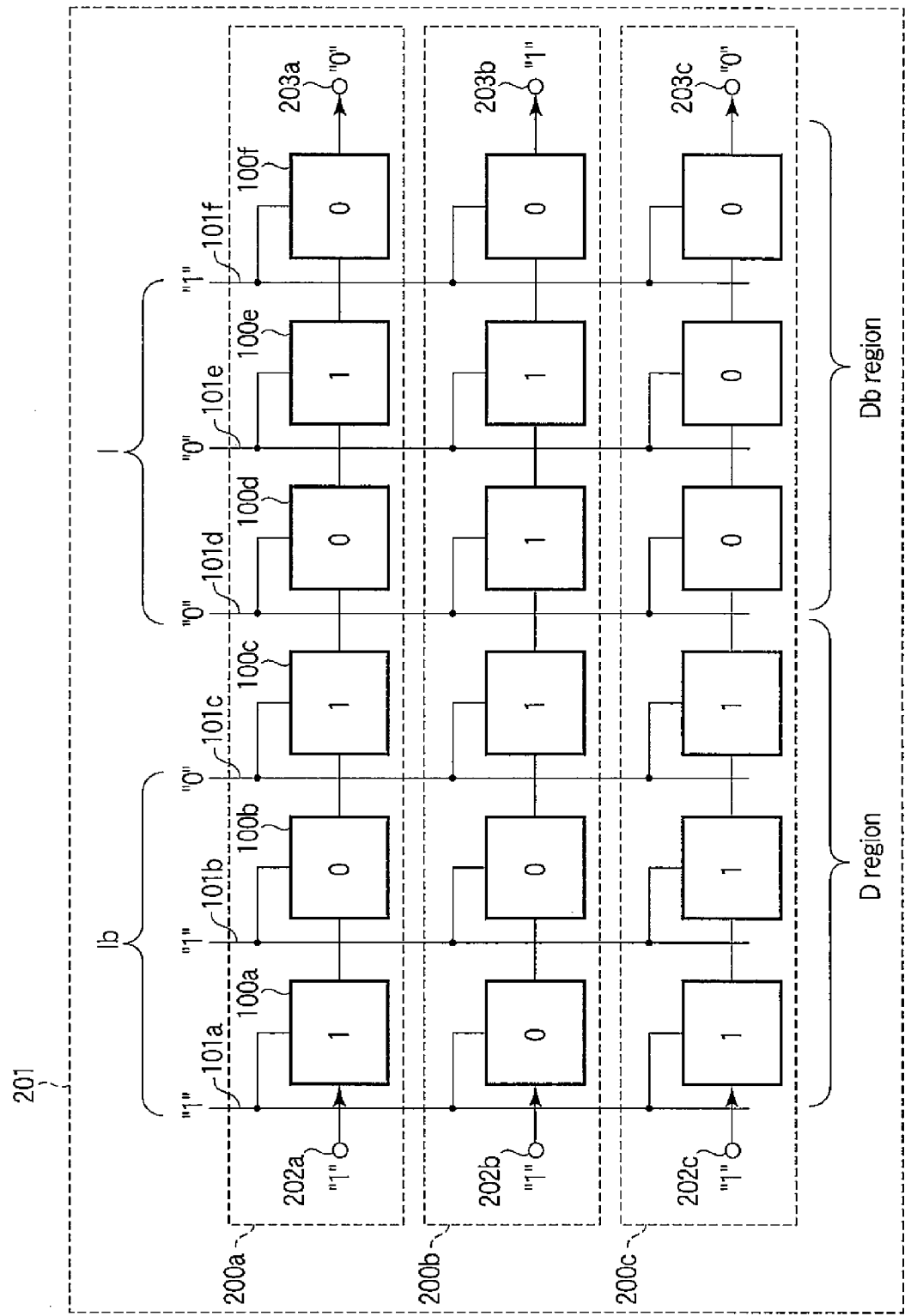
FIG. 3 is a block diagram showing a case where complete coincidence retrieval is made by use of the associative memory device according to the first embodiment.

In general, according to one embodiment, a semiconductor associative memory device comprises a retrieval block having retrieval word strings arranged in a column direction, each of the retrieval word strings comprising memory cells arranged in a row direction between a word input terminal and a word output terminal, each of the memory cells having a first input terminal, a second input terminal, and an output terminal; wherein in each retrieval word string, the second input terminal of one of the memory cells is used as the word input terminal, and each of other memory cells is connected to the output terminal of adjacent memory cell by the second input terminal, wherein the first input terminals of the memory cells in the same column are connected, and wherein the memory cells output "first data" when at least one of input data of the first input terminal and storage data is "first data" and input data of the second input terminal is "first data", and output "second data" in other cases.

The details of the embodiment are explained below with reference to the drawings.

First Embodiment

As shown in FIG. 1, an associative memory device according to this embodiment is configured by serially connecting a plurality of unit retrieval memory cells 100 in a row direction to form retrieval word strings 200 and arranging a plurality of retrieval word strings 200 in a column direction to form a retrieval block 201.

As shown in FIG. 2, the unit retrieval memory cell 100 (MC) includes a first data input terminal 101, a second data input terminal 102, and a data output terminal 103. The memory cell 100 stores digital data corresponding to "0" or "1". When one of data corresponding to a signal input from the first data input terminal 101 and digital data stored in the memory cell 100 or both of them are "1", the same signal as that input from the second data input terminal 102 is output from the data output terminal 103. That is, "1" is output when a signal input from the second input terminal 102 is "1" and "0" is output in the case of "0". Further, when both of a signal input from the first input terminal 101 and held digital data are "0", "0" or instability is output irrespective of an input signal from the second input terminal 102. Further, for example, if "1" is set as an H level signal and "0" is set as an L level signal, instability can be considered as "0" since instability is generally set closer to the L level rather than the H level.

As shown in FIG. 1, the retrieval word string 200 is configured by serially connecting a plurality of memory cells 100 (100a to 100f) in the row direction. In the memory cell 100 (MC), the data output terminal 103 of a preceding-stage memory cell of the respective adjacent cells is connected to the data input terminal 102 of a succeeding-stage memory cell. The retrieval block 201 is configured by separately arranging a plurality of retrieval word strings 200 in the column direction. Then, the memory cells 100 on the same column are connected to commonly have the first input terminals 101 (101a to 101f).

The first data input terminals of the respective retrieval word strings 200 are set as word input terminals 202 and the final data output terminals are set as word output terminals 203. Whether or not the retrieval word string coincides with the present retrieval condition can be determined by checking whether or not a signal input from the word input terminal 202 is output from the word output terminal 203 by means of a sense amplifier or the like. That is, the retrieval word string in which a signal input from the word input terminal 202 is output from the word output terminal 203 is set in a coincident state and the other retrieval word string is set in a non-coincident state.

Next, an example of retrieval using the associative memory device of this embodiment is explained.

(Complete Coincidence Retrieval)

In this embodiment, complete coincidence retrieval of data in the retrieval block 201 is performed as follows.

First, as shown in FIG. 3, the retrieval word strings 200 (200*a* to 200*c*) are respectively divided into two regions of a D region and a Dbar (hereinafter indicated as Db) region. Then, bits of data to be held (stored data) is held in the divided D region and the inverted bits of the stored data are held in the Db region for the respective retrieval word strings 200. In FIG. 3, a case wherein the stored data is configured by 3 bits is shown. In this case, it is necessary to use the retrieval word string 200 formed of at least 6 bits in the combination of the D region and Db region. In the drawing, 3 retrieval word strings 200 respectively storing "101", "001", and "111" are shown as an example.

The retrieval memory system can check whether or not one of the retrieval word strings 200 in the retrieval block 201 stores desired 3-bit data. That is, the retrieval memory system can perform retrieval. In this case, desired to-be-retrieval data I (in this example, that is "001" coincides with the content of the retrieval word string 200*b*) and inverted data Ibar (hereinafter indicated as Ib) thereof are input to the first input terminals 101 (101*a* to 101*f*) as shown in FIG. 3. That is, data Ib is input to the input terminals 101*a* to 101*c* and data I is input to the input terminals 101*d* to 101*f*. The input data is called a "search data". At this time, if "1" is input to the word input terminals 202 (202*a* to 202*c*) of the respective retrieval word strings, "1" is output only in the word output terminal 203*b* of the retrieval word string in which storing data of the D region and data I coincide, that is, the retrieval word string 200*b*. As a result, a word string in which the search data is included can be specified in the retrieval block 201.

(Partial Coincidence Retrieval)

In this embodiment, the partial coincidence retrieval can be performed in addition to the complete coincidence retrieval described before.

In the partial coincidence retrieval, for example, when retrieval of "10x" is performed, it is considered to be coincident even if "1" or "0" is set for "x". "x" is called a "don't care bit". In the partial coincidence retrieval, two cases are considered: a case where data is held in the retrieval word string 200 to permit partial coincidence and a case where a search data is input to permit partial coincidence and retrieval is performed.

Figure 4:
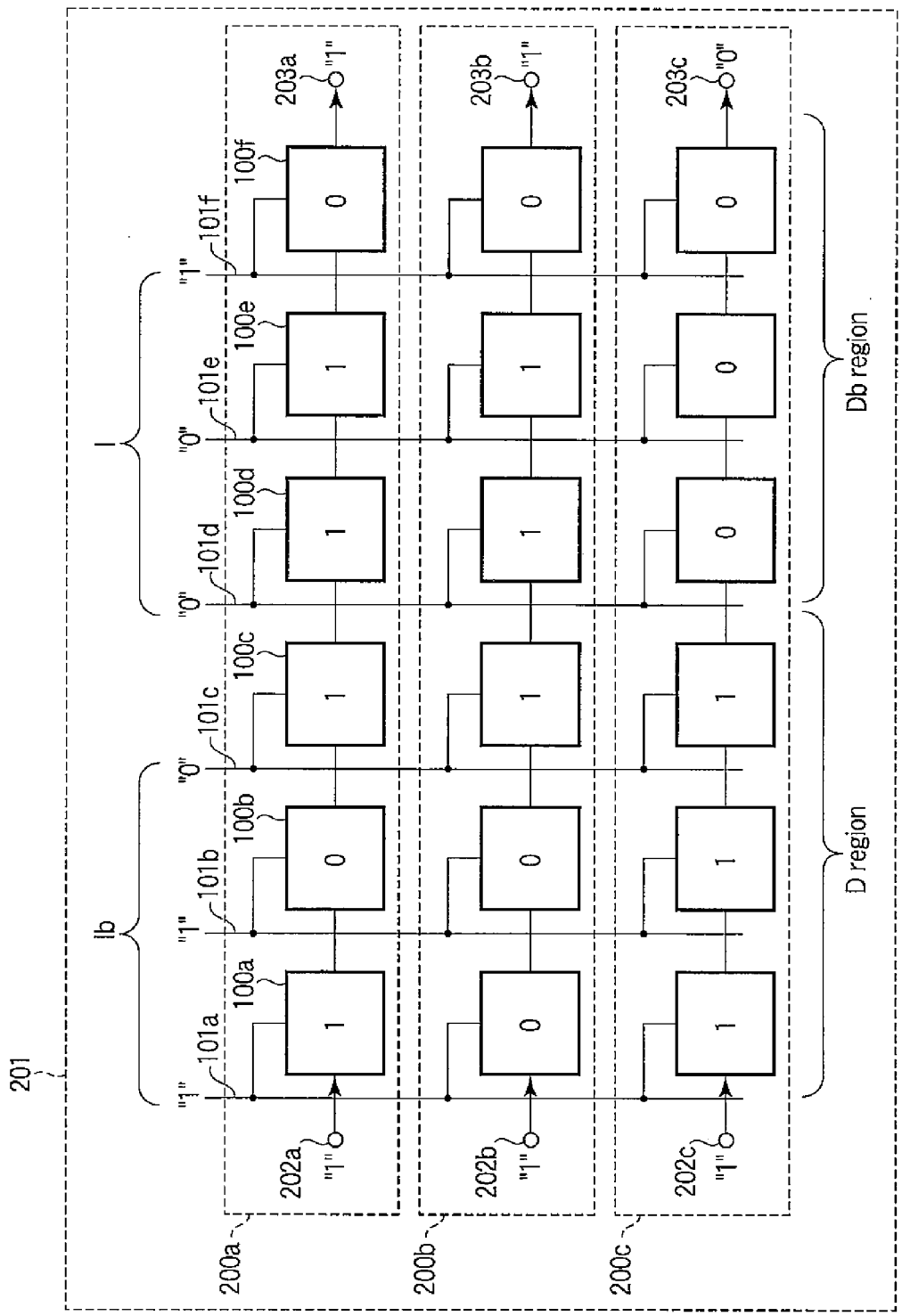
FIG. 4 is a block diagram showing a case where partial coincidence retrieval is made by use of the associative memory device according to the first embodiment.

When data that permits partial coincidence is held in the retrieval word string 200, both of the D region and Db region for the don't care bit are set to "1", and data are set as described before for other bits. That is, in the case of "10x", it is sufficient to store "101" in the D region and "011" in the Db region. An example of thus performing the retrieval is shown in FIG. 4. FIG. 4 shows substantially the same state as FIG. 3, but is different in that data in the retrieval word string 200*a* is set to "x01" (data items of the memory cells 100*a* and 100*d* are not inverted and both are set to "1").

In this case, if "001" is input as the search data, a word output from the retrieval word string 200*b* that completely coincides is "1" as described before, but a word output from the retrieval word string 200*a* is also "1". That is, inputs to the memory cells 100*a* and 100*d* are don't care bits for the retrieval word string 200*a* and it is considered to be coincident even if the retrieval word string is "001" or "101".

Figure 5:
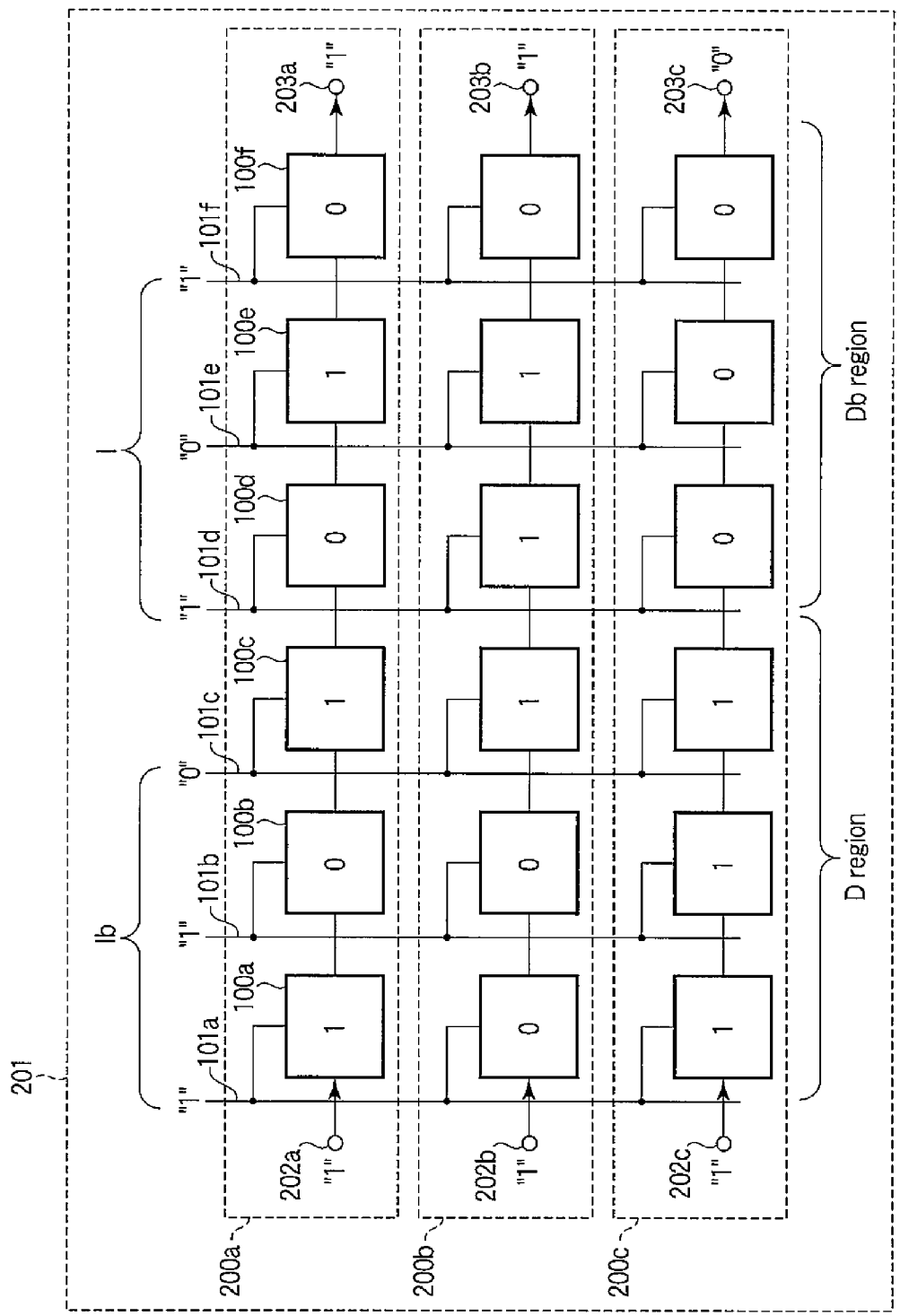
FIG. 5 is a block diagram showing a case where partial coincidence retrieval is made by use of the associative memory device according to the first embodiment.

When a search data that permits partial coincidence is input and retrieval is performed, "1" is input to both of I and Ib with respect to the don't care bit and retrieval is performed. That is, in the case of "10x", "101" may be input as I and "011" may be input as Ib. An example of thus performing the retrieval is shown in FIG. 5. FIG. 5 shows substantially the same state as FIG. 3, but a search data is set to "x01" (input data items of the memory cells 100*a* and 100*d* are not inverted and both are set to "1").

In this case, even if data items of the memory cells connected to the input terminals 101*a* and 101*d* in the retrieval word string are "1" or "0", coincidence/non-coincidence is determined only by means of the other memory cells. That is, inputs to the input terminals 101*a* and 101*d* are set as don't care bits and it is considered to be coincident even if the retrieval word string 200 is "001" or "101".

Application Example of Present Embodiment

As an application example of the CAM, virus scan hardware of computers is considered. That is, definition information of plural viruses is previously held in the retrieval block and whether or not information that coincides with the definition information exists in a specified file is checked to determine whether or not a virus is contained in the file. Since the retrieval is extremely high speed in comparison with the same retrieval process using software, the virus retrieval speed can be greatly increased. Further, since the CAM according to this embodiment can store large-capacity information with the same area in comparison with other systems, a virus definition file can be stored without causing any problem even if the size thereof is large.

Second Embodiment

In the first embodiment explained before, two regions of the D region and Db region are serially connected, but in this embodiment, they are connected to separate output terminals as shown in FIG. 6 and AND operations of outputs of the respective output terminals are set as word outputs. In FIG. 6, the same symbols are attached to the same portions as those of FIG. 1 and the detailed explanation thereof is omitted.

In this embodiment, a retrieval word string is configured to include first word string (D region) 210, second word string (Db region) 220, and AND gate 230. The first word string and the second word string comprise serially connected plural memory cells 100. The memory cells 100 are connected to output terminals of the adjacent cells by second input terminals. The AND gate 230 is connected to the output terminals of the first string 210 and the second string 220 and the output data from the first string 210 and the second string 220 are input to the AND gate 230. A retrieval block is configured by separately arranging a plurality of thus configured retrieval word strings in a column direction.

A stored data is stored in the respective memory cells of the first strings 210 (210*a* to 210*c*) and inverted data of the stored data is stored in the respective memory cells of the second strings 220 (220*a* to 220*c*). "1" is input to word input terminals 202 (202*a* to 202*c*) of the first strings 210 and word input terminals 204 (204*a* to 204*c*) of the second strings 220, search data I to be retrieved is input to first input terminals 101*a* to 101*c* of the respective memory cells of the second string 220 and inverted data Ib of search data I is input to first input terminals 101e to 101f of the respective memory cells of the first string 210.

With the above configuration, the same output result as in the first embodiment can be obtained. Therefore, it is of course possible to perform the same retrieval as that of the first embodiment and the propagation length by which output signals of the respective retrieval memory cells propagate in a row direction can be reduced and higher-speed retrieval can be performed. That is, since the propagation length in the row direction ranges from the word input terminal 202 to the AND gate 230 and is set to half that of the first embodiment, higher-speed retrieval can be performed.

Third Embodiment

Figure 7:
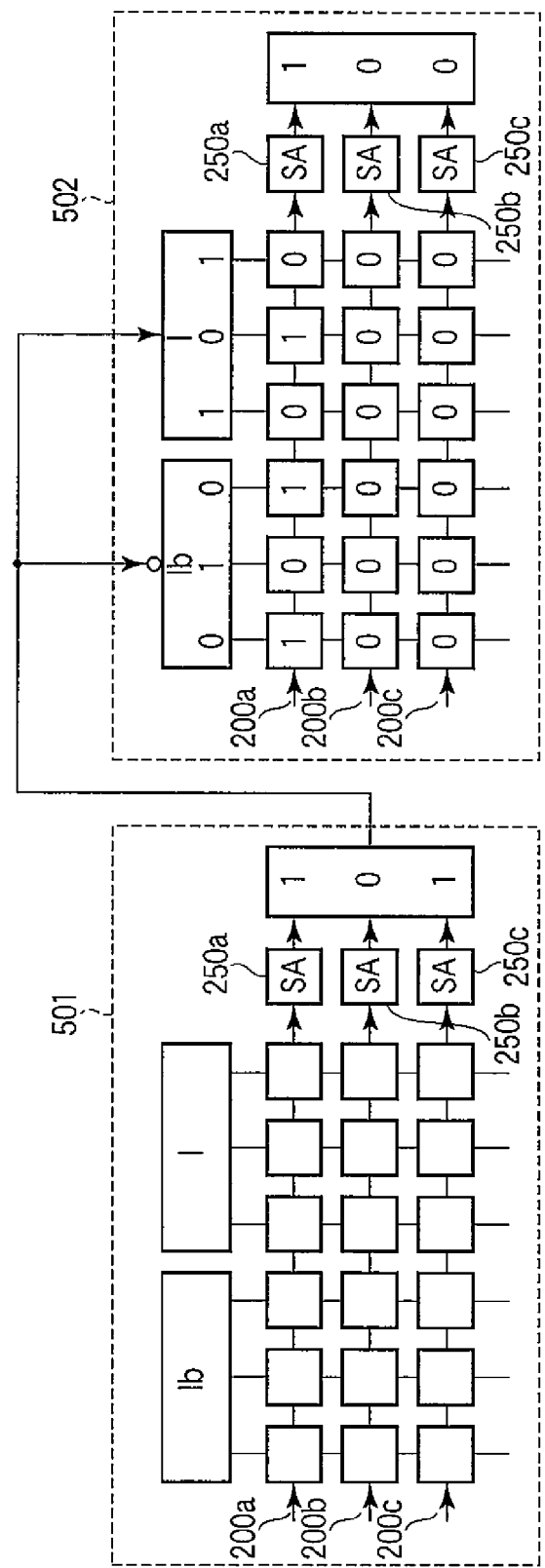
FIG. 7 is a block diagram showing the schematic configuration of an associative memory device according to a third embodiment.

FIG. 7 is a diagram showing the schematic configuration of an associative memory device according to a third embodiment. In FIG. 7, the same symbols are attached to the same portions as those of FIG. 1 and the detailed explanation thereof is omitted. Further, the representation of a retrieval block is simplified, but the function is the same as that of FIG. 1.

A first retrieval block 501 is configured by providing sense amplifiers 250 (250a to 250c) that sense respective outputs of retrieval strings 200 in addition to the retrieval block 201 of FIG. 1. A second retrieval block 502 has basically the same configuration as the first retrieval block 501. An output of the first retrieval block 501 is given as search datas I, Ib input to a D region and Db region of the second retrieval block 502. In this case, a circular mark attached to Ib of the retrieval block 502 means that data is inverted and input.

In this embodiment, an output of the first retrieval block 501 is input to the second retrieval block 502. By doing so, coincidence/non-coincidence for a plurality of stored datas included in the retrieval block 501 can be retrieved.

More specifically, for example, when it is desired to detect that only two retrieval word strings 200a and 200c in the retrieval block 501 detect a coincidence signal, all of the word outputs are input to the retrieval block 502 as search datas. Further, data used to determine whether or not only outputs of the first row and third row of the retrieval block 501 are 1 is previously held in the retrieval word string of a specified row of the block 502 ("101" in the case of FIG. 5).

The above retrieval method is simpler in many cases than in a case where all of the word outputs of the retrieval block 501 are checked to determine that only the retrieval word string 200a and retrieval word string 200c are set to "1". As a result, according to this embodiment, an attempt can be made to further increase the retrieval speed.

Fourth Embodiment

FIG. 8 is a block diagram showing an associative memory device according to a fourth embodiment. In FIG. 8, the same symbols are attached to the same portions as those of FIG. 1 and the detailed explanation thereof is omitted.

In this embodiment, like the retrieval block 501 of FIG. 7, a retrieval block 601 is configured by adding sense amplifiers 250 (250a to 250C) to the retrieval block 201 of FIG. 1. Then, outputs of the retrieval block 601 that are sense results of the sense amplifiers 250 are input to a memory block 602. By so doing, coincidence/non-coincidence retrieval with respect to data of desired length can be made irrespective of the length of retrieval word strings configuring the retrieval block 601.

In FIG. 8, a retrieval block configured by three retrieval word strings 200 (200a to 200c) configured by 3 bits and the memory block 602 capable of storing word outputs thereof and configured by an SRAM or DRAM, for example, are shown as an example. In the example of FIG. 8, the memory block 602 is configured by bits of the number of words of the retrieval block 601, that is, 3 bits or more.

In this case, it is assumed that a stored data is information of 5 bits exceeding 3 bits that are one word of the retrieval block 601 and this is "11010". In this case, 5-bit information is divided and held in the retrieval word string 200b and retrieval word string 200c of the retrieval block 601, for example. Further, the final one bit of a stored data is a don't care bit described before. In the retrieval word string 200a, data "101" of a different stored data is held.

If "110" is input to the retrieval block 601 as a search data, a word output of the retrieval word string 200b is set to "1". In this case, if an output of the retrieval word string 200c is set to "1" in next retrieval, it can be determined that "11010" is input. Since such a retrieval method can be repeatedly performed a desired number of times, retrieval of data with a desired bit width can be performed irrespective of the number of bits of one word.

Further, if the present embodiment is utilized, a retrieval memory that retrieves whether or not a specified bit string is present in a location separated by a desired bit width can be realized.

That is, using the example described before, if it is confirmed that an output of the retrieval word string 200b of the retrieval block 601 and an output of the retrieval word string 200c are set to "1" in this order "not necessarily successively", whether or not it is data that coincides with "110*10x" (in this case, * indicates data with desired bit width) can be determined.

Fifth Embodiment

Next, a unit retrieval memory cell realizing method used in the first to fourth embodiments is explained.

As a unit retrieval memory cell 100, a desired element or circuit can be used that includes two of first and second input terminals 101, 102 and one output terminal 103, can store digital data corresponding to "0" or "1", outputs "1" when one of an input signal and held digital data or both of them are 1 and the other input signal is also "1" and outputs "0" or instability in the other case. An example of the element used for the unit retrieval memory cell 100 is shown below.

Figure 9:
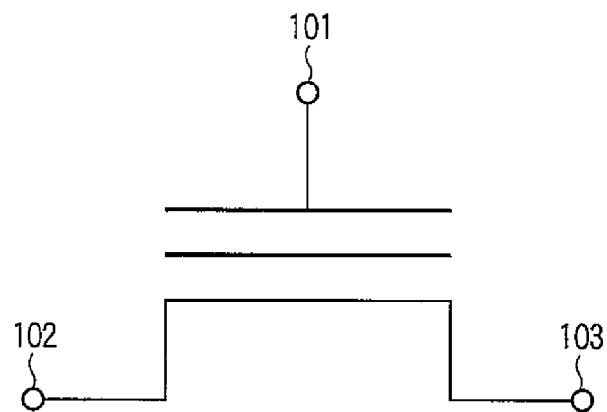
FIG. 9 is a circuit diagram showing the concrete configuration of a unit retrieval memory cell.

FIG. 9 shows a flash memory cell having a floating gate; the control gate corresponds to the first input terminal 101, the source corresponds to the second input terminal 102 and the drain corresponds to the output terminal 103. The flash memory cell can control ON/OFF of a transistor according to charges stored in the floating gate. Therefore, the state in which charges that set normally ON are written to the floating gate is set as "1" and the state in which charges that set normally OFF are written to the floating gate is set as "0". Further, the first input signal is set to "1" when a potential that is sufficient to turn ON the channel is applied to the control gate even in the state in which the floating gate is set normally OFF and is set to "0" when a potential storing the OFF state is applied if the floating gate is set to normally OFF. Then, ON/OFF of the channel respectively indicates "1/0" of the second input signal and output signal and it can be used as a unit retrieval memory cell.

The above unit retrieval memory cell is suitable for realizing a retrieval memory cell that is inexpensive and with high precision since a footprint used as an element is extremely small.

Figure 10:
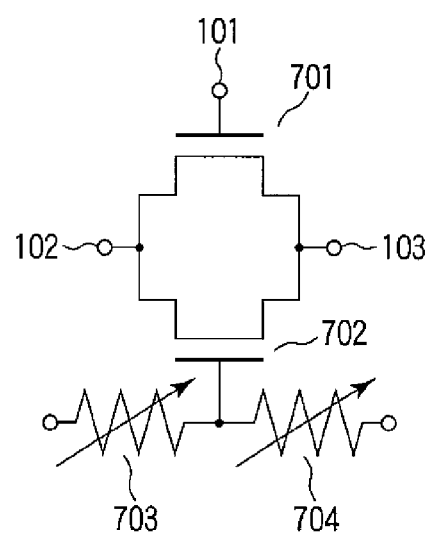
FIG. 10 is a circuit diagram showing the concrete configuration of a unit retrieval memory cell.

FIG. 10 is a unit retrieval memory cell configured by two pass-transistors 701, 702 and variable resistance elements 703, 704. The first and second variable resistance elements 703, 704 are serially connected and the first and second pass-transistors 701, 702 are connected in parallel with the sources and drains commonly used. Further, the gate of the second pass-transistor 702 is connected to a connection node of the first and second variable resistance elements 703, 704. Then, the gate of the first pass-transistor 701 corresponds to the first input terminal 101, the common source corresponds to the second input terminal 102 and the common drain corresponds to the output terminal 103.

Under normal operation, a voltage (hereinafter referred to as Vdd) enough to turn ON the pass-transistor 702 is applied to the variable resistance element 704 and 0 V is coupled to the variable resistance element 703. By doing so, ON/OFF of the second pass-transistor 702 can be controlled according to the magnitude of the variable resistance. Terminals opposite to the connection node of the variable resistance elements 703, 704 are used as program terminals of the variable resistance elements.

Further, as shown in FIG. 11, one variable resistance element 704 can be replaced by a diode 705. As the variable resistance element, a two-terminal memory such as a PRAM, PRAM can be used. In such a unit retrieval memory cell, since a footprint can be formed small by forming a memory portion by using an interconnection layer, an inexpensive retrieval memory with high density can be realized. Further, since the memory portion and transistor portion can be separately designed, an advantage that the resistance of the transistor can be set minimum can be attained. Further, when a retrieval memory array is formed as described later, an advantage that signal detection can be easily made is attained.

Figure 13:
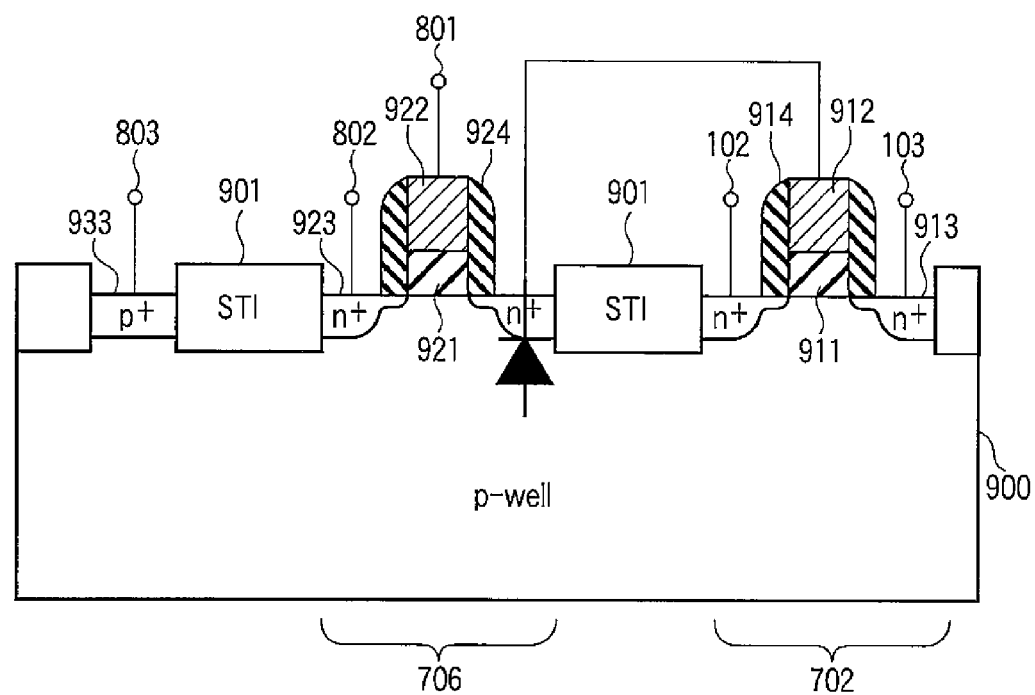
FIG. 13 is a cross-sectional view showing the element structure of the unit retrieval memory cell of FIG. 12.

Further, as shown in FIG. 12, a retrieval memory cell using a flash memory cell 706 instead of the variance resistance element 703 can be used. In this case, 801 indicates the control gate of the flash memory cell 706. Further, the diode 705 connected to 803 can be realized by the cross-sectional structure as shown in FIG. 13 without actually forming a diode element. That is, the diode 705 can be mounted without forming the additional structure on the memory cell 706.

Part 900 in FIG. 13 is a semiconductor substrate and 901 is an element isolation insulating film (STI). Part 911 is a gate insulating film of HfSiON or the like, 912 is a gate electrode, 913 is an n-type source/drain region, 914 is a sidewall insulting film and the second pass-transistor 702 is configured by the above elements. 921 is a gate insulating film of ONO or the like, 922 is a gate electrode, 923 is a source/drain region, 924 is a gate sidewall insulating film and the flash memory cell 706 is configured by the above elements. Further, 933 in FIG. 13 indicates a p-type diffusion layer used for forming a diode.

In order to use the above circuit as a unit retrieval memory cell, the following operation is performed. That is, the threshold value is set to previously set the conductance of the flash memory cell 706 sufficiently high or low, Vdd is coupled to the control gate 801 and 0 V is coupled to the source terminal 802. Then, the second pass-transistor 706 becomes OFF when the conductance is sufficiently low and the second pass-transistor 706 becomes ON when the conductance is sufficiently high. If such a unit retrieval memory cell is used, the resistance of the transistor can be suppressed to minimum while an increase in the footprint is suppressed to minimum.

Figure 14:
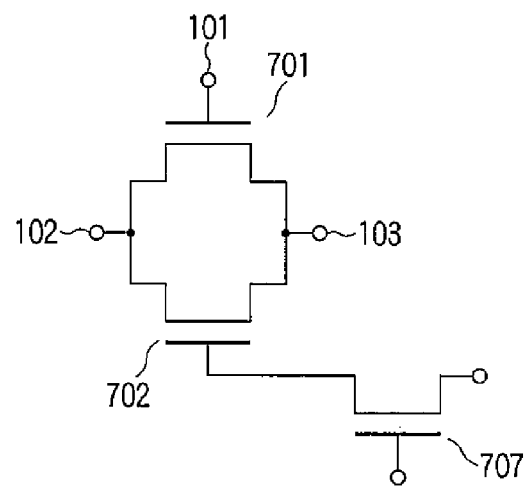
FIG. 14 is a circuit diagram showing the concrete configuration of a unit retrieval memory cell.

FIG. 14 is a unit retrieval memory cell formed of three transistors. The first and second pass-transistors 701, 702 are connected in parallel and the drain of a third pass-transistor 707 is connected to the gate of the second pass-transistor 702.

With the above configuration, ON/OFF of the second pass-transistor 702 can be controlled by setting the third pass-transistor 7070N and inputting "0" or "1" to the source (write electrode) of the pass-transistor 707. However, since written information is lost with time by a leak current of the second pass-transistor 702, periodic refresh is required.

(Modification)

This invention is not limited to the embodiments described above. The unit retrieval memory cell is not limited to the configurations shown in FIGS. 9 to 12, 14 and any configuration can be used if it outputs "1" when at least one of input data of the first input terminal and store state is "1" and input data of the second input terminal is "1" and outputs "0" in the other case. Further, the number of memory cells of the retrieval word string can be adequately changed according to the specification. Likewise, the number of retrieval word strings of the retrieval block can be adequately changed according to the specification.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor associative memory device comprising:
    a retrieval block having retrieval word strings arranged in a column direction, each of the retrieval word strings comprising memory cells arranged in a row direction between a word input terminal and a word output terminal, each of the memory cells having a first input terminal, a second input terminal, and an output terminal;
    wherein in each retrieval word string, the second input terminal of one of the memory cells is used as the word input terminal, and each of other memory cells is connected to the output terminal of an adjacent memory cell by the second input terminal,
    wherein first input terminals of the memory cells in the same column are connected, and
    wherein the memory cells output "first data" when at least one of input data of the first input terminal and storage data is "first data" and input data of the second input terminal is "first data", and output "second data" in other cases.

2. The device of claim 1, each of the retrieval word strings is divided into a D region in which a stored data is stored and a Db region in which inverted data of the stored data is stored, "first data" is input to second input terminals of head memory cells of the retrieval word strings, a search data I is input to the first input terminals of the respective memory cells in the Db region and inverted data Ib of the search data is input to the first input terminals of the respective memory cells in the D region.

3. The device of claim 1, the stored data includes a don't care bit that is permitted even if a logical value is "first data" or "second data" and "first data" is stored in both of the D region and Db region for the bit.

4. The device of claim 1, the search data includes a don't care bit that is permitted even if a logical value is "first data" or "second data" and both of the search data I and inverted data Ib are set to "first data" for the bit.

5. The device of claim 1, further comprising sense amplifiers that are provided for the respective retrieval word strings and detect outputs of the final memory cells of the retrieval word strings and a memory block that stores detected values of the respective sense amplifiers.

6. The device of claim 1, each of the memory cells is a flash memory cell having a floating gate, a control gate of the flash memory is the first input terminal, a source is the second input terminal and a drain is the output terminal.

7. The device of claim 1, each of the memory cells is configured to include first and second pass-transistors whose sources and drains are commonly connected to each other, a first variable resistance element that is connected at one end to a gate of the second pass-transistor and a second variable resistance element that is connected at one end to the gate of the second pass-transistor,
wherein a gate of the first pass-transistor is the first input terminal, the common source of the first and second pass-transistors is the second input terminal and the common drain of the first and second pass-transistors is the output terminal.

8. The device of claim 1, each of the memory cells is configured to include first and second pass-transistors whose sources and drains are commonly connected to each other, a variable resistance element that is connected at one end to a gate of the second pass-transistor and a diode that is connected at one end to the gate of the second pass-transistor,
wherein a gate of the first pass-transistor is the first input terminal, the common source of the first and second pass-transistors is the second input terminal and the common drain of the first and second pass-transistors is the output terminal.

9. The device of claim 1, each of the memory cells is configured to include first and second pass-transistors whose sources and drains are commonly connected to each other, a flash memory cell that is connected at one end to a gate of the second pass-transistor and a diode that is connected at one end to the gate of the second pass-transistor,
wherein a gate of the first pass-transistor is the first input terminal, the common source of the first and second pass-transistors is the second input terminal and the common drain of the first and second pass-transistors is the output terminal.

10. The device of claim 1, each of the memory cells is configured to include first and second pass-transistors whose sources and drains are commonly connected to each other and a third pass-transistor that is connected at one end to a gate of the second pass-transistor,
wherein a gate of the first pass-transistor is the first input terminal, the common source of the first and second pass-transistors is the second input terminal and the common drain of the first and second pass-transistors is the output terminal.

11. A semiconductor associative memory device comprising:
a retrieval block having retrieval word strings arranged in a column direction, each of the retrieval word strings comprising memory cells and an AND gate arranged in a row direction between a first word input terminal and a second word input terminal, each of the memory cells having a first input terminal, a second input terminal, and an output terminal;
wherein in each retrieval word string, second input terminals of two of the memory cells are used as the first and second word input terminals, and each of other memory cells is connected to the output terminal of an adjacent memory cell by the second input terminal,
half of the memory cells arranged between the first word input terminal and the AND gate are used as a first string, and other memory cells arranged between the second word input terminal and the AND gate are used as a second string,
first input terminals of the memory cells in the same column are connected, and
the memory cells output "first data" when at least one of input data of the first input terminal and storage data is "first data" and input data of the second input terminal is "first data", and output "second data" in other cases.

12. The device of claim 11, wherein each of the memory cells of the first string stores a search word, each of the memory cells of the second string stores inverted data on the search word, "first data" is input to second input terminals of the respective head memory cells of the first and second strings, search data I is input to the first input terminals of the respective memory cells of the second string, and inverted data Ib on the search data I is input to the first input terminals of the respective memory cells of the first string.

13. A semiconductor associative memory device comprising:
a first retrieval block and a second retrieval block each having retrieval word strings arranged in a column direction, each of the retrieval word strings comprising memory cells arranged in a row direction between a word input terminal and a word output terminal, each of the memory cells having a first input terminal, a second input terminal, and an output terminal,
wherein in each retrieval word string, the second input terminal of one of the memory cells is used as the word input terminal, and each of other memory cells is connected to the output terminal of an adjacent memory cell by the second input terminal,
first input terminals of the memory cells in the same column are connected,
the memory cells output "first data" when at least one of input data of the first input terminal and storage data is "first data" and input data of the second input terminal is "first data", and output "second data" in other cases,
each of the retrieval word strings in the first retrieval block is divided into a D region in which a first stored data is stored and a Db region in which inverted data on the word is stored, and
each of the retrieval word strings in the second retrieval block is divided into a D region in which a second stored data is stored and a Db region in which inverted data on the word is stored.

14. The device of claim 13, wherein in the first retrieval block, "first data" is input to second input terminals of head memory cells of the retrieval word strings, search data I is input to the first input terminals of the respective memory cells in the Db region and inverted data Ib on the search data Ib is input to the first input terminals of the respective memory cells in the D region, and
in the second retrieval block, "first data" is input to the second input terminals of head memory cells of the retrieval word strings, an output of the first retrieval block is input to the first input terminals of the respective memory cells in the Db region as search data J, and inverted data Jb on the search data J is input to the first input terminals of the respective memory cells in the D region.

* * * * *